US008289667B2

(12) United States Patent
Morrish

(10) Patent No.: US 8,289,667 B2
(45) Date of Patent: Oct. 16, 2012

(54) CURRENT LIMITING SURGE PROTECTION DEVICE

(75) Inventor: Andrew J. Morrish, Saratoga, CA (US)

(73) Assignee: Bourns, Inc., Riverside, CA (US)

( * ) Notice: Subject to any disclaimer, the term of this patent is extended or adjusted under 35 U.S.C. 154(b) by 795 days.

(21) Appl. No.: 12/386,510

(22) Filed: Apr. 16, 2009

(65) Prior Publication Data
US 2009/0279225 A1  Nov. 12, 2009

Related U.S. Application Data

(60) Provisional application No. 61/124,588, filed on Apr. 16, 2008, provisional application No. 61/194,939, filed on Oct. 1, 2008.

(51) Int. Cl.
*H02H 9/00* (2006.01)
(52) U.S. Cl. .......................................... 361/58
(58) Field of Classification Search ............. 361/58, 361/111
See application file for complete search history.

(56) References Cited

U.S. PATENT DOCUMENTS

| 3,369,129 A | 2/1968 | Wolterman |
| 5,656,968 A | 8/1997 | Sander et al. |
| 5,696,659 A * | 12/1997 | Maruo ............... 361/93.1 |
| 6,970,337 B2 * | 11/2005 | Strahm ............... 361/58 |
| 7,324,315 B2 * | 1/2008 | Harris ............... 361/58 |
| 7,576,962 B2 * | 8/2009 | Harris ............... 361/58 |
| 7,616,418 B2 * | 11/2009 | Harris ............... 361/58 |
| 7,646,576 B2 * | 1/2010 | Harris et al. ........... 361/111 |
| 8,169,763 B2 * | 5/2012 | Morrish ............. 361/93.1 |
| 8,223,467 B2 * | 7/2012 | Morrish ............. 361/58 |
| 2005/0128669 A1 * | 6/2005 | Harris ............... 361/91.1 |
| 2006/0098363 A1 * | 5/2006 | Hebert et al. ........... 361/56 |
| 2006/0158816 A1 * | 7/2006 | Harris ............... 361/118 |
| 2006/0176638 A1 * | 8/2006 | Coates ............... 361/118 |
| 2006/0285264 A1 * | 12/2006 | Harris ............... 361/58 |
| 2007/0035906 A1 * | 2/2007 | Harris et al. ........... 361/118 |
| 2009/0122456 A1 * | 5/2009 | Morrish ............. 361/111 |
| 2009/0231773 A1 * | 9/2009 | Morrish ............. 361/101 |
| 2009/0279225 A1 * | 11/2009 | Morrish ............. 361/111 |

FOREIGN PATENT DOCUMENTS

WO   WO93/01639   1/1993

* cited by examiner

*Primary Examiner* — Ronald W Leja
(74) *Attorney, Agent, or Firm* — Lumen Patent Firm

(57) ABSTRACT

A current-limiting surge protection device is provided. The current-limiting surge protection device includes a pair of series connected normally on MOSFET's and a pair of voltage controlled normally off switches that are disposed to monitor a voltage across the normally on MOSFET pair. Here, the voltage controlled normally off switches close according to an excess threshold voltage across the MOSFET pair and reduces a gate drive potential of the normally on MOSFET pair to limit a current through the normally on MOSFET pair.

13 Claims, 8 Drawing Sheets

(a) PRIOR ART (b) PRIOR ART

CURRENT LIMITING SURGE PROTECTION DEVICE

CROSS-REFERENCE TO RELATED APPLICATIONS

This application claims priority from U.S. Provisional Patent Application 61/124,588 filed Apr. 16, 2008, which is incorporated herein by reference. This application claims priority from U.S. Provisional Patent Application 61/194,939 filed Oct. 1, 2008, which is incorporated herein by reference.

FIELD OF THE INVENTION

The invention relates generally to electronic devices. More particularly, the invention relates to current-limiting surge protection devices using series connected normally on MOSFET's and voltage controlled normally off switches.

BACKGROUND

In most electrical protection applications, it is essential for the protecting device to switch to a state where current flow into the protected equipment is substantially blocked or limited. This general observation holds for various protection approaches, such as fuses, circuit breakers, and transient blocking units (TBUs).

Current limiters can be utilized when the resulting power dissipation during a fault protection condition is limited to a level that is insufficient to cause damage to the current limiting device.

In VDSL applications 100, such as in FIG. 1a, the driver 102 is AC coupled by virtue of the transformer, and hence long term short circuit currents at the line side cannot cause sustained DC currents in the driver. A current limiting protection device can therefore be advantageously used to protect the driver.

Whereas a TBU will drastically reduce the output current when the current rises above a certain threshold, a current limiter will limit the current at a particular level, thus preventing excessive currents in the driver in the event of a transient. As the transient is short lived, by virtue of the AC coupling, a sustained fault due to lightning or power cross cannot cause problems of over dissipation in the current limiter.

FIG. 1b shows a graph of a generally poor linearity of a prior art current limiting device, where it is known that a changing gate drive to both the forward and reversed transistor elements causes modulation of the transistor resistances. Consequently, the linearity error may become significant at currents above about 50% of the required limiting threshold.

What is needed is a current limiting device that provides area savings, cost reduction and improvement in resistance compared to the use of a standard TBU. Further, there is a need for a solution for protecting low voltage drivers in the VDSL application for example, where low resistance, good linearity and fast response is key.

SUMMARY OF THE INVENTION

To overcome the shortcomings in the art, the present invention provides a current-limiting surge protection device having a pair of series connected normally on MOSFET's and a pair of voltage controlled normally off switches that are disposed to monitor a voltage across the normally on MOSFET pair. Here, the voltage controlled normally off switches close according to an excess threshold voltage across the MOSFET pair and reduces a gate drive potential of the normally on MOSFET pair to limit a current through the normally on MOSFET pair.

According to one embodiment of the invention, the current-limiting surge protection device further includes gate protection of the pair of voltage controlled normally off switches, where the gate protection has a first diode clamp disposed between a first normally off voltage controlled switch and a first terminal and a second diode clamp disposed between a second normally off voltage controlled switch and a second terminal.

According to one aspect of the invention, the normally on MOSFET is a depletion mode MOSFET. Here, the depletion mode MOSFET can be an NMOS or a PMOS.

In another aspect, the voltage controlled normally off switch is at least one enhancement mode MOSFET. Here, the enhancement mode MOSFET can be an enhancement mode NMOS or an enhancement mode PMOS, selected in accordance to the depletion mode device.

According to another embodiment, a drain of a first normally on MOSFET is connected to a first terminal and a drain of a second normally on MOSFET is connected to a second terminal, where a gate of the first normally on MOSFET is resistively connected to the first terminal and a gate of the second normally on MOSFET is resistively connected to the second terminal. Here, the gate of the first normally on MOSFET is further connected to a source of a first normally off enhancement mode MOSFET and the gate of the second normally on MOSFET is further connected to a source of a second normally off enhancement mode MOSFET. Additionally, a gate of the first normally off enhancement mode MOSFET is resistively connected to the first terminal and a drain of the first normally off enhancement mode MOSFET is connected to the second terminal and a gate of the second normally off enhancement mode MOSFET is resistively connected to the second terminal and a drain of the second normally off enhancement mode MOSFET is connected to the first terminal.

In one aspect of this embodiment, the gate of the first normally off enhancement mode MOSFET is further connected to the second terminal by a first diode clamp and the gate of the second normally off enhancement mode MOSFET is further connected to the first terminal by a second diode clamp.

In another aspect of this embodiment, the normally on MOSFET is a depletion mode MOSFET, where the depletion mode MOSFET can be an NMOS or a PMOS.

In yet another aspect of the current embodiment, the voltage controlled normally off switch is an enhancement mode MOSFET, where the enhancement mode MOSFET can be an enhancement mode NMOS or an enhancement mode PMOS.

According to another embodiment of the invention, the voltage controlled normally off switch is a pair of series connected enhancement mode MOSFET's, where a drain of a first normally on MOSFET is connected to a first terminal and a drain of a second normally on MOSFET is connected to a second terminal, and a gate of the first normally on MOSFET is resistively connected to the first terminal and a gate of the second normally on MOSFET is resistively connected to the second terminal. Here, the gate of the first normally on MOSFET is further connected to a drain of a first normally off enhancement mode MOSFET and a source of the first normally off enhancement mode MOSFET is connected to a source of a second normally off enhancement mode MOSFET and a drain of the second normally off enhancement mode MOSFET is connected to the second terminal, where the gate of the second normally on MOSFET is further connected to a drain of a third normally off enhancement mode MOSFET and a source of the second normally off enhancement mode MOSFET is connected to a source of a fourth normally off enhancement mode MOSFET and a drain of the fourth normally off enhancement mode MOSFET is connected to the first terminal. Additionally, a gate of the first normally off enhancement mode MOSFET is resistively connected to the first terminal and further connected to a gate of the second normally off enhancement mode MOSFET and the gate of the second normally off enhancement mode MOSFET is further connected to the second terminal comprising a first diode clamp, where a gate of the third normally off enhancement mode MOSFET is resistively connected to the second terminal and further connected to a gate of the fourth normally off enhancement mode MOSFET and the gate of the fourth normally off enhancement mode MOSFET is further connected to the first terminal by a second diode clamp. Further, a substrate of the first normally off enhancement mode MOSFET is connected to a substrate of the second normally off enhancement mode MOSFET and further connected to the source of the first normally on MOSFET and a substrate of the third normally off enhancement mode MOSFET is connected to a substrate of the fourth normally off enhancement mode MOSFET and further connected to a source of the second normally on MOSFET.

According to one aspect of this embodiment, the normally on MOSFET is a depletion mode MOSFET, where the depletion mode MOSFET can be an NMOS or a PMOS.

According to another aspect of this embodiment, the enhancement mode MOSFET can be an enhancement mode NMOS or an enhancement mode PMOS.

BRIEF DESCRIPTION OF THE FIGURES

The objectives and advantages of the present invention will be understood by reading the following detailed description in conjunction with the drawing, in which.

DETAILED DESCRIPTION OF THE INVENTION

Although the following detailed description contains many specifics for the purposes of illustration, anyone of ordinary skill in the art will readily appreciate that many variations and alterations to the following exemplary details are within the scope of the invention. Accordingly, the following preferred embodiment of the invention is set forth without any loss of generality to, and without imposing limitations upon, the claimed invention.

A current limiter is a device that limits the flow of current through it to be less than some predetermined value. Thus, the main difference between a current limiter and more typical protection devices is that a current limiter doesn't actually turn off when its threshold is reached or exceeded.

The present invention is a new type of current limiting device for blocking short duration transients. It is particularly useful in low cost data-line protection applications, such as VDSL.

According to one embodiment, the current limiting device is a simple, lowest cost device, suitable for many applications where linearity is not a critical concern. The devices of the current invention provide better linearity, at only minimal cost in area and process complexity compared to what is known in the art, utilizing a reversed enhancement mode NMOS to detect the voltage across the limiter, and then reducing gate drive, hence providing a limited 'trip' function. The invention also provides better control of the depletion mode gate voltage, and hence results in better linearity, at only minimal cost in area and process complexity compared to prior art versions. According to one embodiment, using a composite of a normally connected and a reverse connected NMOS devices makes no special requirement for the NMOS design, and can use standard LDMOS type designs with source connected to substrate. This design provides the best peak current to high voltage current, and is lowest cost to manufacture. It is understood that NMOS devices are used as exemplary devices, where these devices are MOSFET devices that can be an NMOS or a PMOS devices.

The invention provides area savings, cost reduction and improvement in resistance compared to the use of a standard TBU, for example.

Figure 2:
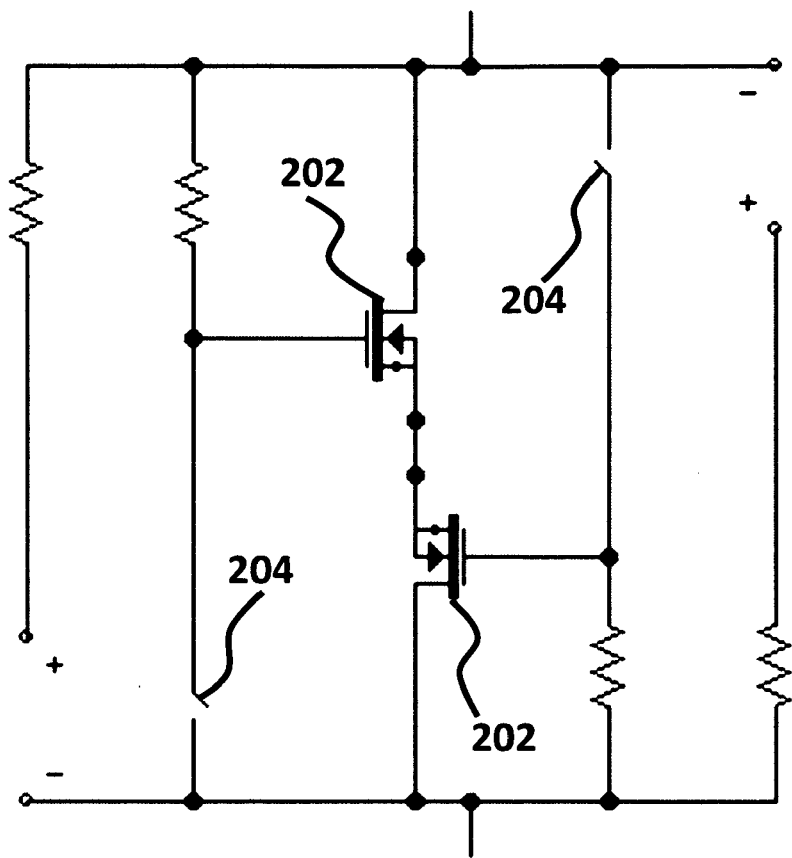
FIG. 2 shows a generic voltage controlled current limiter with gate protection according to the present invention.

FIG. 2 shows a generic current-limiting surge protection device 200 according to the current invention, having a pair of series connected normally on MOSFET's 202 and a pair of voltage controlled normally off switches 204 that are disposed to monitor a voltage across the normally on MOSFET pair 202. Here, the voltage controlled normally off switches 204 close according to an excess threshold voltage across the MOSFET pair 202 and reduces a gate drive potential of the normally on MOSFET pair 202 to limit a current through the normally on MOSFET pair 202.

Figure 1:
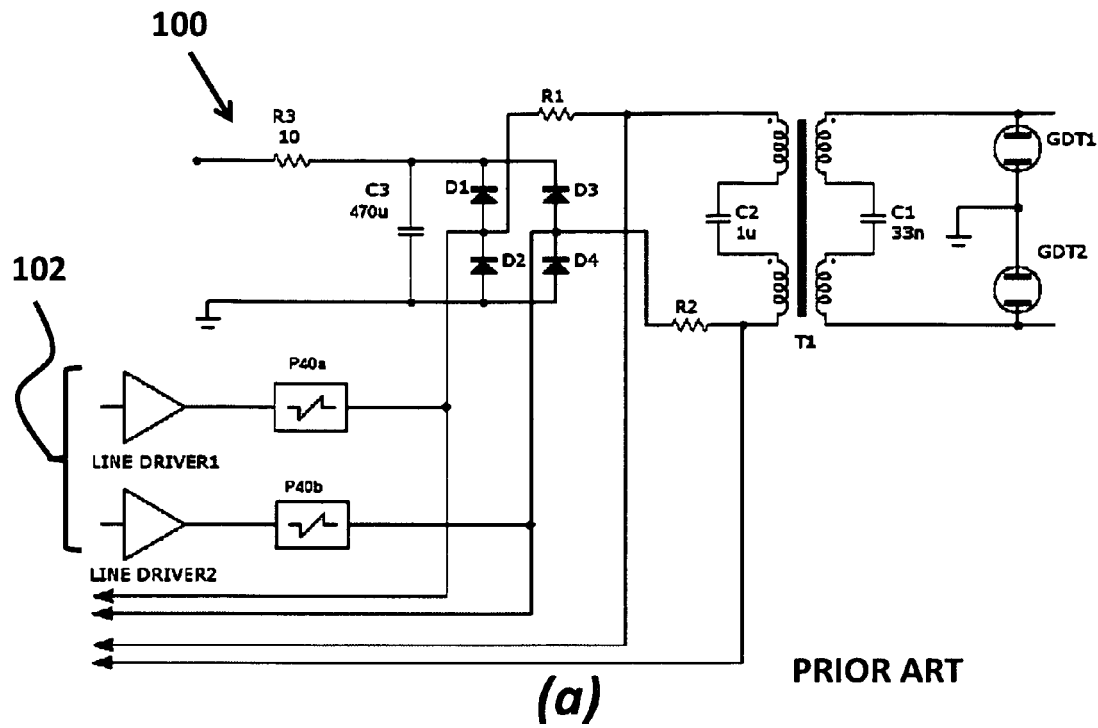
FIG. 1a shows a typical VDSL application protected by TBUs.
FIG. 1b shows a graph of the linearity of a prior art current limiter circuit.
Figure 1:
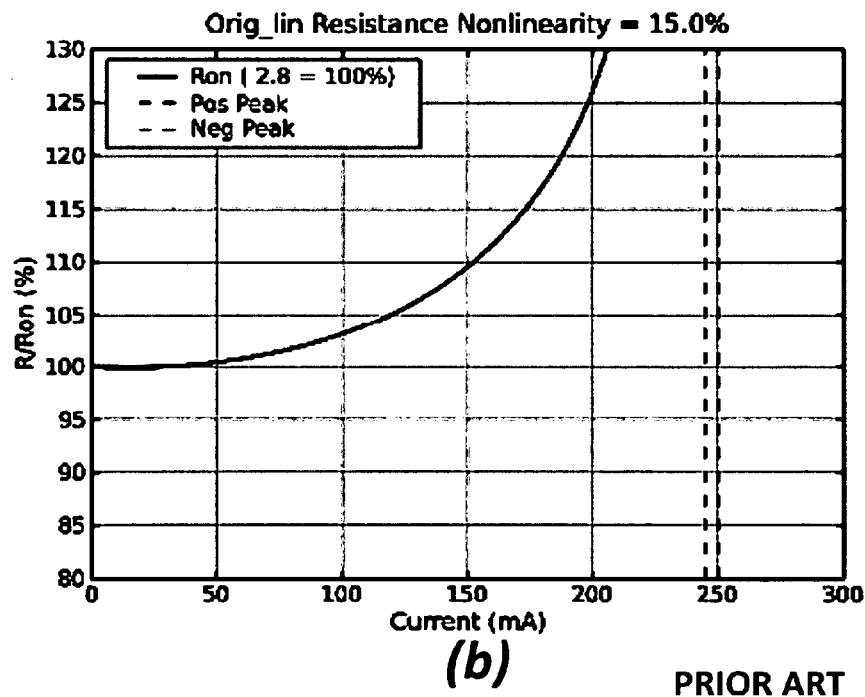

As opposed to the poor performance of the prior art current limiting device shown in FIG. 1b, the current limiting function of the current invention provides perfect protection for the driver, as the output current is limited to well within the capabilities of the output driver.

The current limiter of the current invention offers advantages over the conventional TBU protection because the total resistance is only controlled by the two MOSFET's, rather than the NMOS and a series PJFET—more than 40% of the typical low voltage TBU resistance. It can be seen therefore that the current limiter allows a device that is smaller, lower resistance, and lower cost than the existing protection devices.

Figure 3:
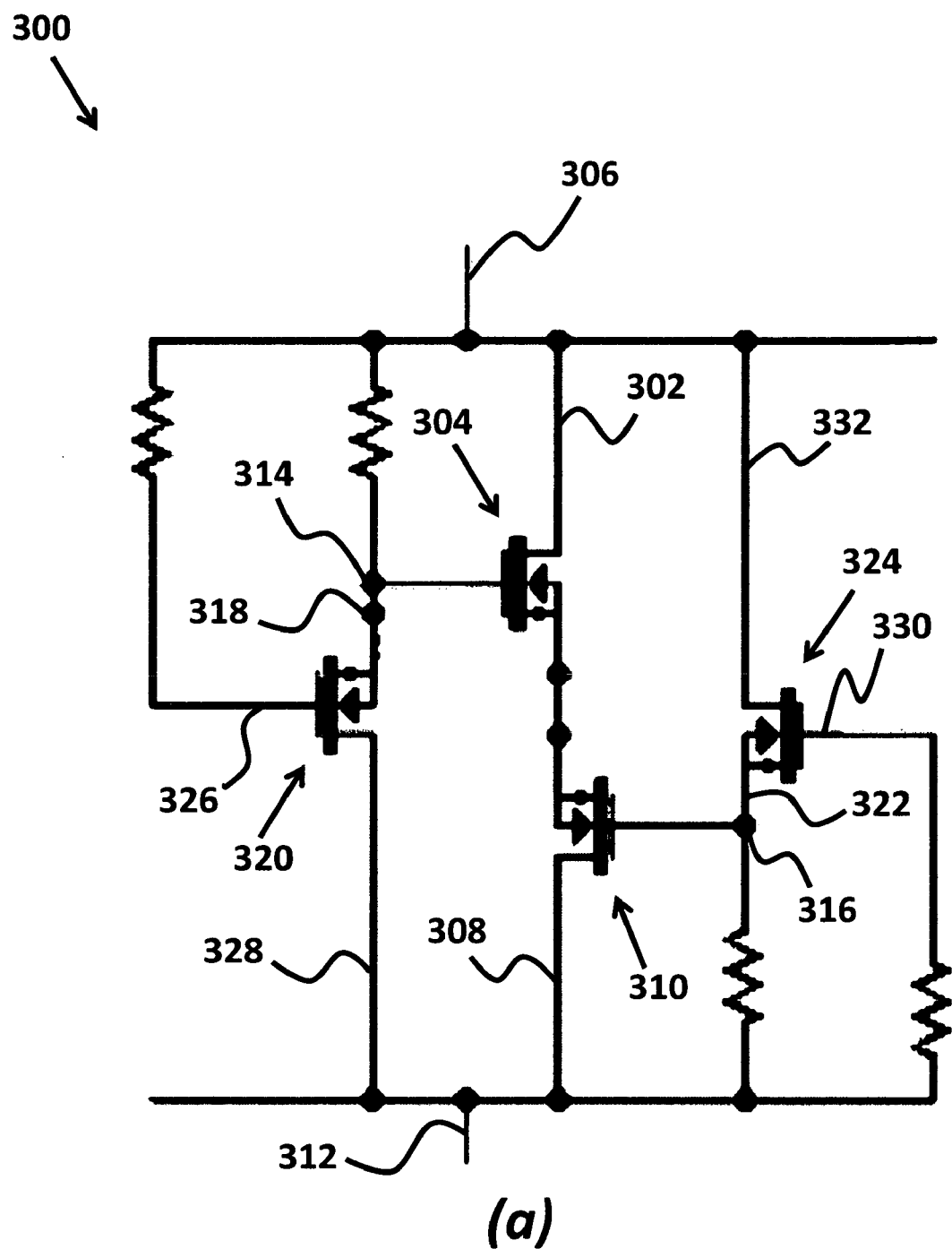
FIGS. 3a-3b show an enhanced current limiter and an enhanced current limiter with gate protection, respectively, according to the present invention.
Figure 3:
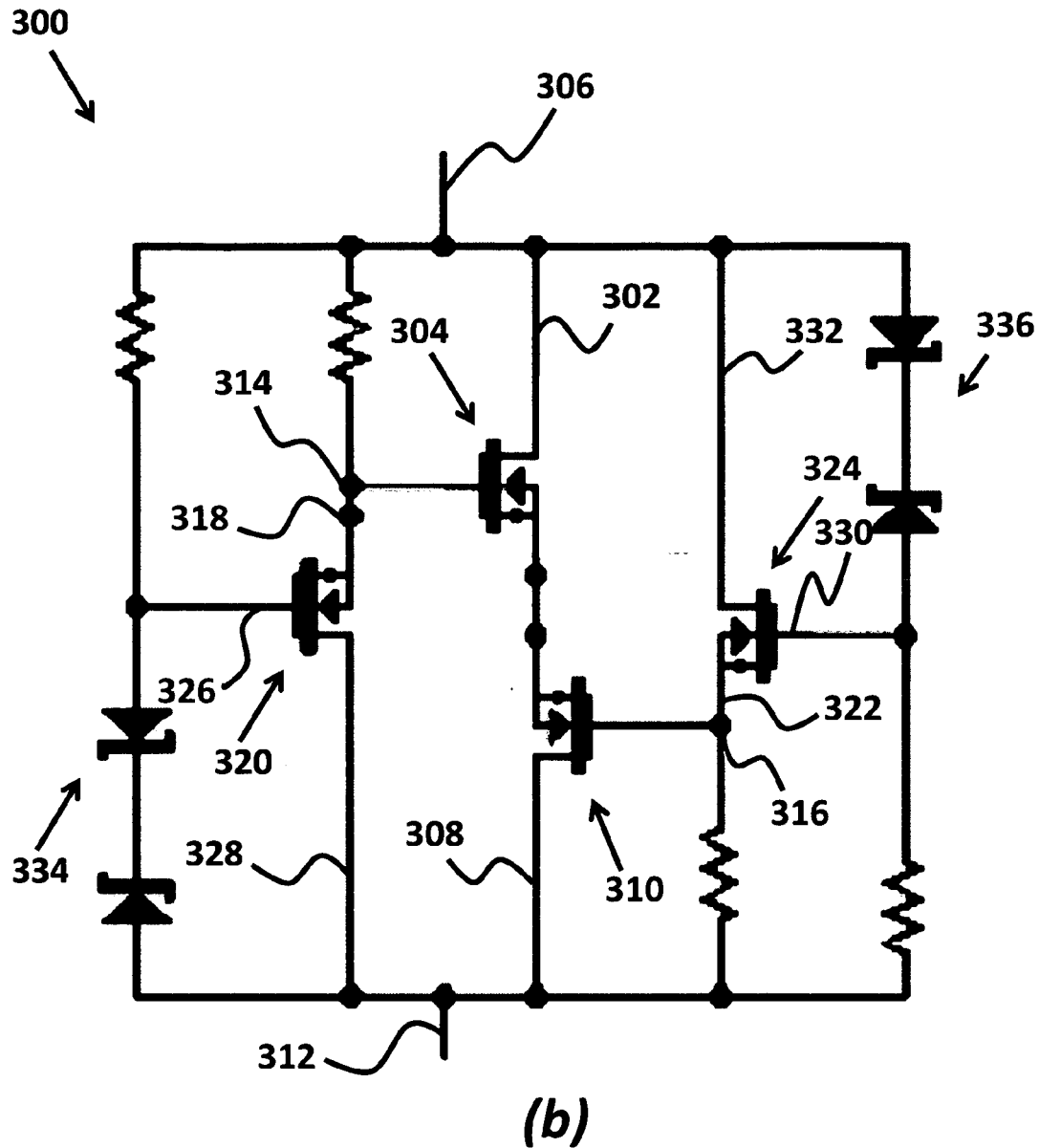

For some applications involving analog-based signal transmission, linearity is a critical concern. An improved limiter circuit 300 suitable for these applications is shown in FIG. 3a, and with additional gate protection in FIG. 3b. In this implementation, two small enhancement mode devices 302 and 304 are connected in such a way that enhancement mode NMOS 304 is normally off when a positive voltage is applied across the device 300. Note that 302 is reverse biased across its source and drain, and is initially off.

As shown in FIGS. 3a and 3b, a drain 302 of a first normally on MOSFET 304 is connected to a first terminal 306 and a drain 308 of a second normally on MOSFET 310 is connected to a second terminal 312, where a gate 314 of the first normally on MOSFET 304 is resistively connected to the first terminal 306 and a gate 316 of the second normally on MOSFET 310 is resistively connected to the second terminal 312. Here, the gate 314 of the first normally on MOSFET 304 is further connected to a source 318 of a first normally off enhancement mode MOSFET 320 and the gate 316 of the second normally on MOSFET 310 is further connected to a source 322 of a second normally off enhancement mode MOSFET 324. Additionally, a gate 326 of the first normally off enhancement mode MOSFET 320 is resistively connected to the first terminal 306 and a drain 328 of the first normally off enhancement mode MOSFET 320 is connected to the second terminal 312 and a gate 330 of the second normally off enhancement mode MOSFET 324 is resistively connected to the second terminal 312 and a drain 332 of the second normally off enhancement mode MOSFET 324 is connected to the first terminal 306.

As shown in FIG. 3b, the gate 326 of the first normally off enhancement mode MOSFET 320 is further connected to the second terminal 312 by a first diode clamp 334 and the gate 330 of the second normally off enhancement mode MOSFET 324 is further connected to the first terminal 306 by a second diode clamp 336. It is understood that the embodiments of current limiter of the present invention can be bi-directional as shown, or unidirectional (not shown).

Figure 4:
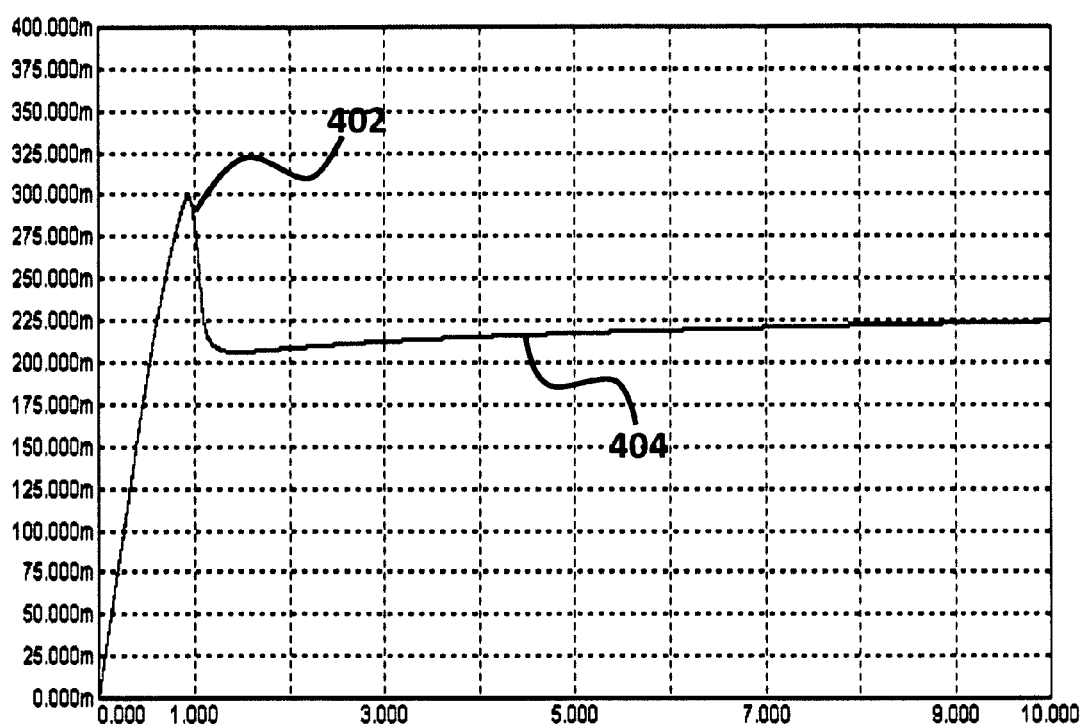
FIG. 4 shows a simulation of the circuit shown in FIG. 3a, according to the present invention.

For example, when a surge occurs, the voltage dropped across the two normally-on depletion mode NMOS, 304 and 310, due to the surge current, rises such that it turns on the reversed NMOS 320. This causes this reverse NMOS 320 to turn on, thus reducing the gate drive to 306. This results in an increase in resistance of 304, and hence a drop of around 30% in the current compared to the peak 402, as shown in FIG. 4, where also shown is a constant current 404 level controlled by a DM device.

Figure 5:
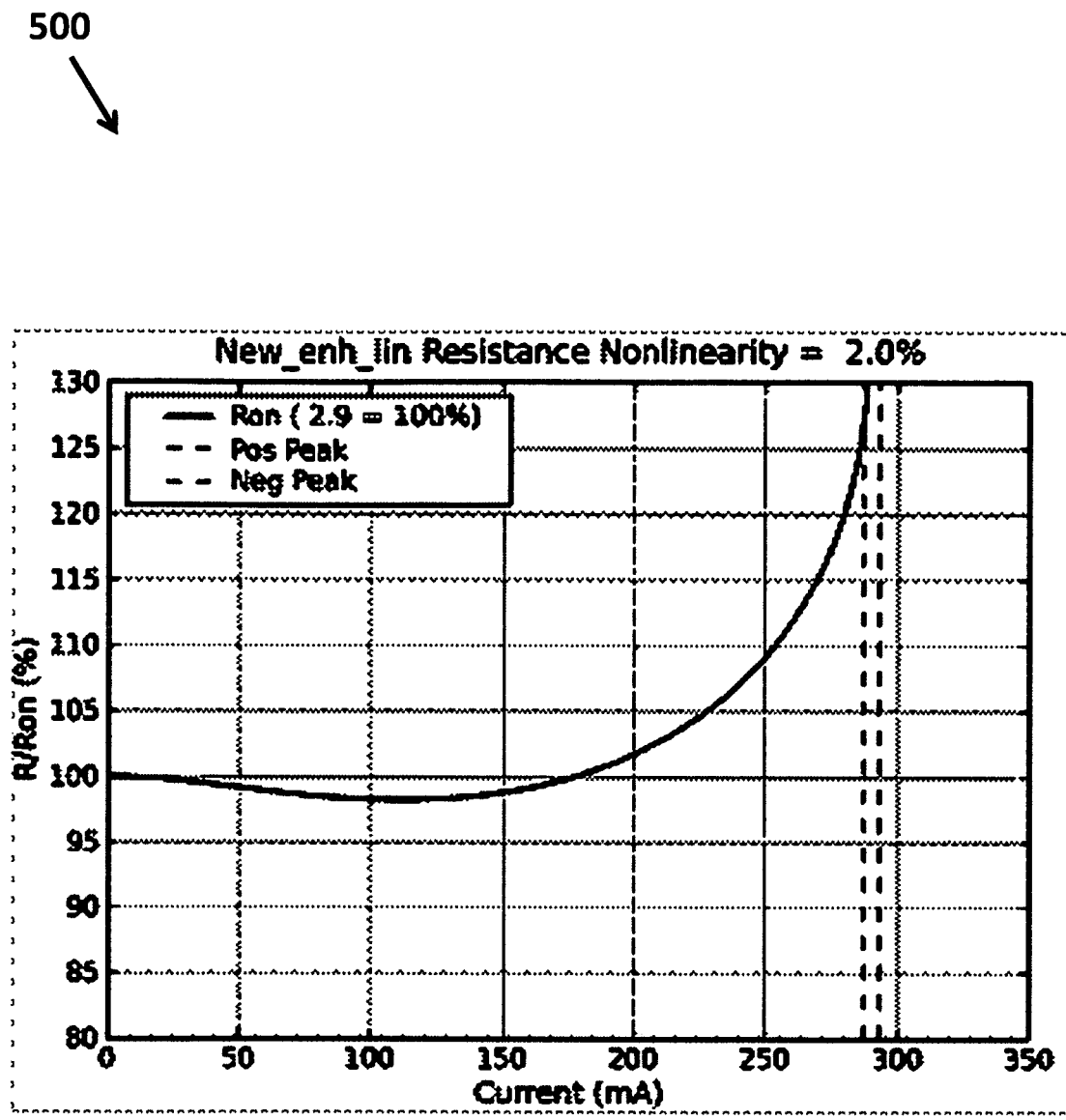
FIG. 5 shows a graph of the improved device for sensitive analog applications linearity of ($\Delta R/R$) of the circuit shown in FIG. 3a, according to the present invention.

This enhanced current limiter achieves a significant degree of current reduction, thus further reducing stress on the application. In addition, in normal use, the gate drive to the NMOS 304 is such that the resistance change of the NMOS 304 is minimal with increased current, considerably improving the linearity of the device for sensitive analog applications, as shown in FIG. 5, where shown, the linearity at 70% of the limiting current is seen to be only 2%, compared to the prior art having 15% shown in FIG. 1b.

The circuits shown in FIGS. 3a-3b perform the function of the improved current limiter, but in practice may be difficult to realize due to the possible interactions through the resistive substrate connection in a monolithic device. SOI techniques may be used to provide isolation, but this may be an undesirable additional cost to the device.

Figure 6:
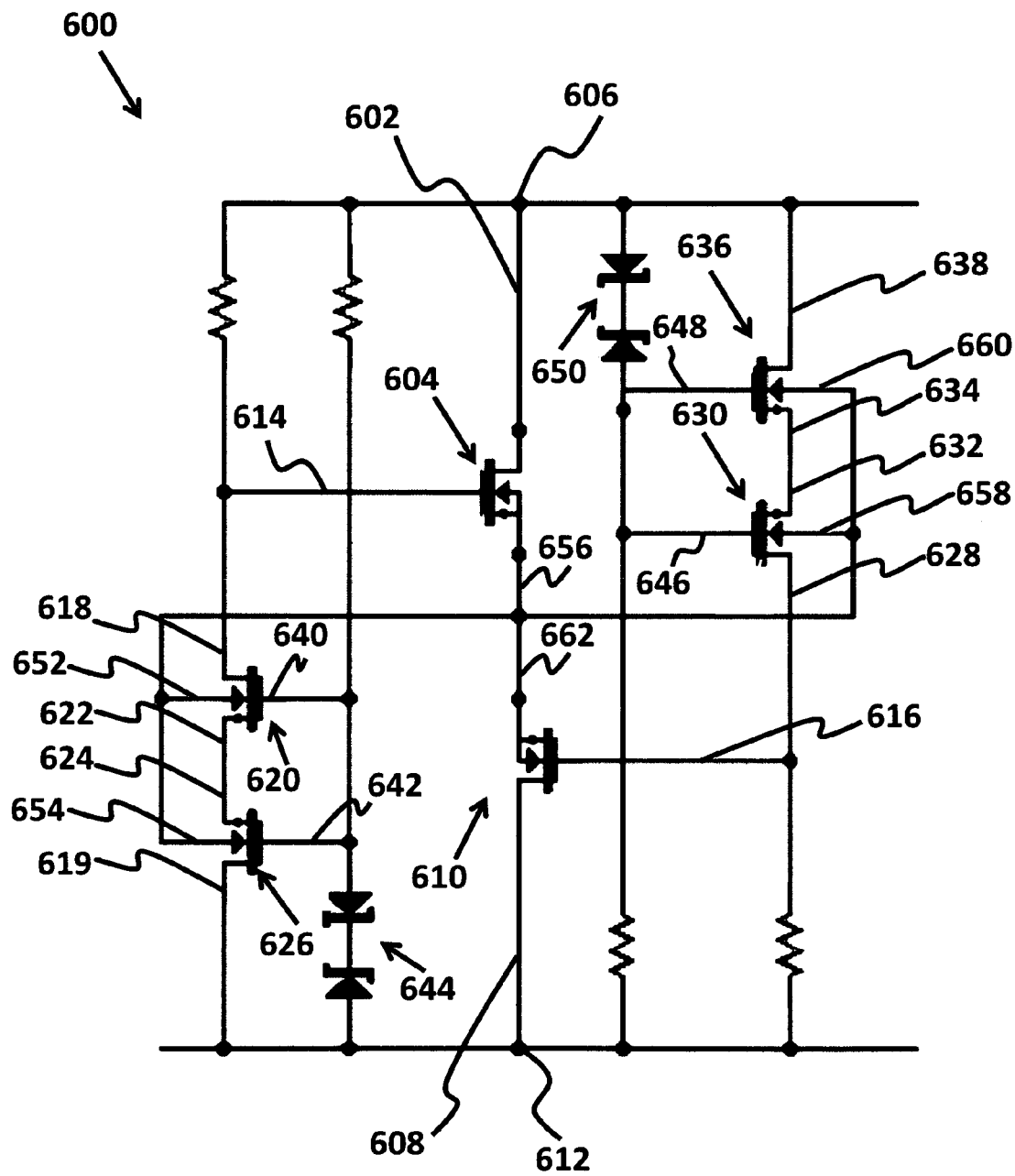
FIG. 6 shows one embodiment having enhancement mode devices in series with control transistors, according to the current invention.

To overcome this problem, the current limiter circuit 600 shown in FIG. 6 having enhancement mode devices in series with control transistors can be used.

As shown, the voltage controlled normally off switch is a pair of series connected enhancement mode MOSFET's, where a drain 602 of a first normally on MOSFET 604 is connected to a first terminal 606 and a drain 608 of a second normally on MOSFET 610 is connected to a second terminal 612, and a gate 614 of the first normally on MOSFET 604 is resistively connected to the first terminal 606 and a gate 616 of the second normally on MOSFET 610 is resistively connected to the second terminal 612. Here, the gate 614 of the first normally on MOSFET 604 is further connected to a drain 618 of a first normally off enhancement mode MOSFET 620 and a source 622 of the first normally off enhancement mode MOSFET 620 is connected to a source 624 of a second normally off enhancement mode MOSFET 626 and a drain 619 of the second normally off enhancement mode MOSFET 620 is connected to the second terminal, where the gate 616 of the second normally on MOSFET 610 is further connected to a drain 628 of a third normally off enhancement mode MOSFET 630 and a source 632 of the second normally off enhancement mode MOSFET 630 is connected to a source 634 of a fourth normally off enhancement mode MOSFET 636 and a drain 638 of the fourth normally off enhancement mode MOSFET 636 is connected to the first terminal 606. Additionally, a gate 640 of the first normally off enhancement mode MOSFET 620 is resistively connected to the first terminal 606 and further connected to a gate 642 of the second normally off enhancement mode MOSFET 626 and the gate 642 of the second normally off enhancement mode MOSFET 624 is further connected to the second terminal 612 by a first diode clamp 644, where a gate 646 of the third normally off enhancement mode MOSFET 630 is resistively connected to the second terminal 612 and further connected to a gate 648 of the fourth normally off enhancement mode MOSFET 636 and the gate 648 of the fourth normally off enhancement mode MOSFET 636 is further connected to the first terminal 606 by a second diode clamp 650. Further, a substrate 652 of the first normally off enhancement mode MOSFET 620 is connected to a substrate 654 of the second normally off enhancement mode MOSFET 626 and further connected to the source 656 of the first normally on MOSFET 604 and a substrate 658 of the third normally off enhancement mode MOSFET 630 is connected to a substrate 660 of the fourth normally off enhancement mode MOSFET 636 and further connected to a source 662 of the second normally on MOSFET.

For example, in this implementation, additional enhancement mode NMOS 602 and 604 are used in series with the control transistors 606 and 608. The enhancement mode transistors 602 and 604 may use floating source type process e.g. such as an SOI type as before.

Alternatively, and preferably for cost and ease of processing, the NMOS 602 and 604 may all be of a more conventional LDMOS (not shown) design, where the substrate and source are connected. In this case, there is a simple requirement that the substrate must be of sufficiently high resistivity that the current drawn through the substrate connection to 606 causes negligible voltage drop across 606 when it turns on. This requirement is easily accommodated by appropriately sizing the devices 606 and 608 with substrates that are used in typical NMOS-type process designs.

As before, gate protection to the enhancement mode devices provided by the resistor/Zener diode clamp.

Figure 7:
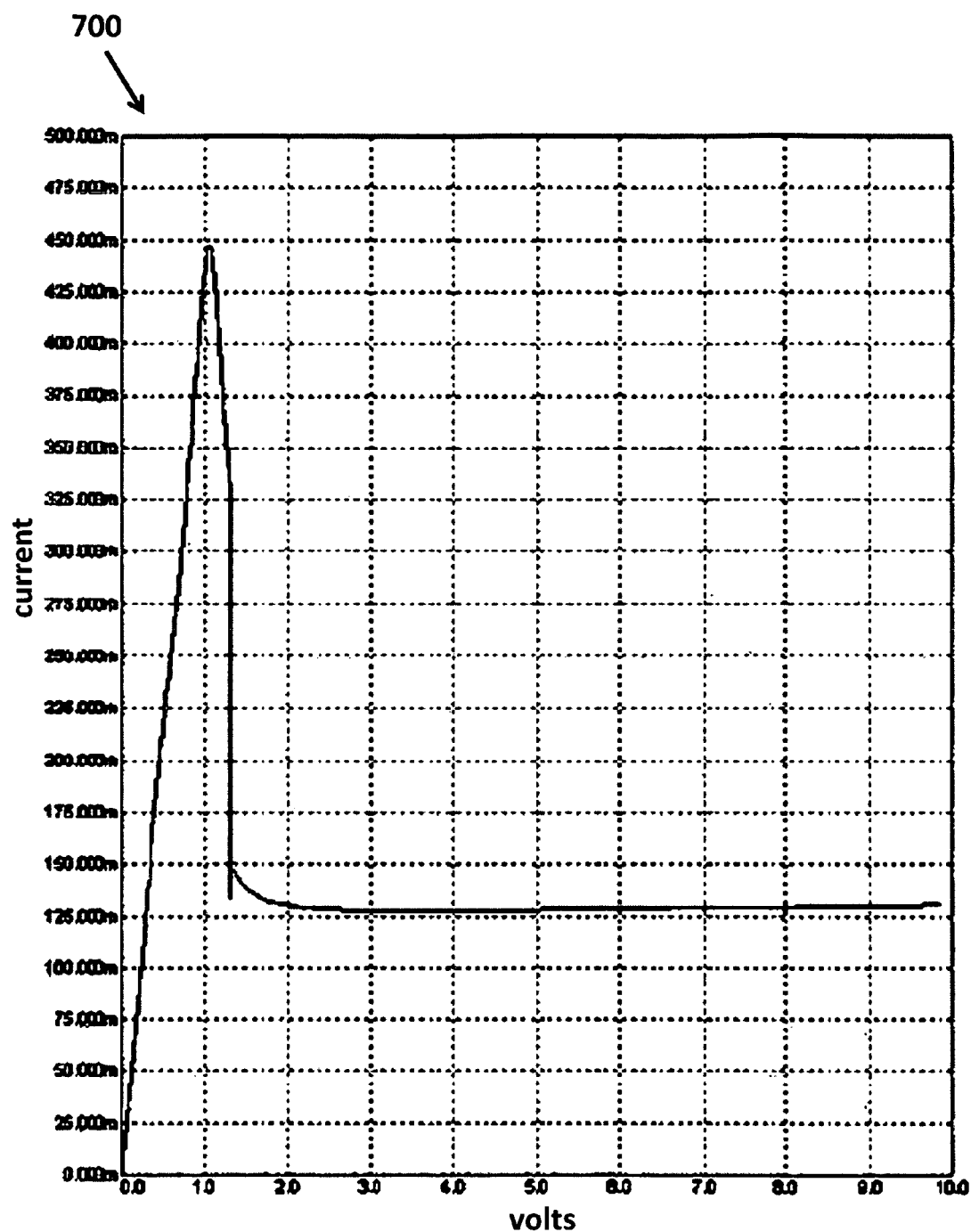
FIG. 7 shows current vs. voltage for a current limiter implementation, according to the current invention.

The addition of the 2 NMOS 602 and 604 now allows greater control of the gate of depletion mode device, as the positive extreme of the gate voltage (of say 610) is not limited by the diode action of the reversed enhancement mode NMOS 606. This results in higher trip current to high voltage current, as shown in FIG. 7. It is understood that though the above exemplary embodiments are bi-directional, embodiments unidirectional are within the scope of the current invention.

The present invention has now been described in accordance with several exemplary embodiments, which are intended to be illustrative in all aspects, rather than restrictive. Thus, the present invention is capable of many variations in detailed implementation, which may be derived from the description contained herein by a person of ordinary skill in the art.

All such variations are considered to be within the scope and spirit of the present invention as defined by the following claims and their legal equivalents.

What is claimed is:

1. A bi-directional current-limiting surge protection device comprising a pair of series connected normally on MOSFET's, wherein said series connection comprises a source to source connection disposed for bi-directional current-limiting, and a pair of voltage controlled normally off switches that are disposed to monitor a voltage across said normally on MOSFET pair, wherein said voltage controlled normally off switches close according to an excess threshold voltage across said source to source connected MOSFET pair and reduces a gate drive potential of said normally on MOSFET pair to limit a current through said normally on MOSFET pair.

2. The current-limiting surge protection device of claim 1, wherein said voltage controlled normally off switch is at least one enhancement mode MOSFET.

3. The current-limiting surge protection device of claim 2, wherein said enhancement mode MOSFET is selected from the group consisting of an enhancement mode NMOS and an enhancement mode PMOS.

4. The current-limiting surge protection device of claim 1, wherein a drain of a first normally on MOSFET is connected to a first terminal and a drain of a second normally on MOSFET is connected to a second terminal, wherein a gate of said first normally on MOSFET is resistively connected to said first terminal and a gate of said second normally on MOSFET is resistively connected to said second terminal, wherein said gate of said first normally on MOSFET is further connected to a source of a first normally off enhancement mode MOSFET and said gate of said second normally on MOSFET is further connected to a source of a second normally off enhancement mode MOSFET, wherein a gate of said first normally off enhancement mode MOSFET is resistively connected to said first terminal and a drain of said first normally off enhancement mode MOSFET is connected to said second terminal and a gate of said second normally off enhancement mode MOSFET is resistively connected to said second terminal and a drain of said second normally off enhancement mode MOSFET is connected to said first terminal.

5. The current-limiting surge protection device of claim 4, wherein said gate of said first normally off enhancement mode MOSFET is further connected to said second terminal comprising a first diode clamp and said gate of said second normally off enhancement mode MOSFET is further connected to said first terminal comprising a second diode clamp.

6. The current-limiting surge protection device of claim 4, wherein said normally on MOSFET is a depletion mode MOSFET.

7. The current-limiting surge protection device of claim 6, wherein said depletion mode MOSFET is selected from the group consisting of an NMOS and a PMOS.

8. The current-limiting surge protection device of claim 4, wherein said voltage controlled normally off switch is an enhancement mode MOSFET.

9. The current-limiting surge protection device of claim 8, wherein said enhancement mode MOSFET is selected from the group consisting of an enhancement mode NMOS and an enhancement mode PMOS.

10. The current-limiting surge protection device of claim 1, wherein said voltage controlled normally off switch comprises a pair of series connected enhancement mode MOSFET's, wherein a drain of a first normally on MOSFET is connected to a first terminal and a drain of a second normally on MOSFET is connected to a second terminal, wherein a gate of said first normally on MOSFET is resistively connected to said first terminal and a gate of said second normally on MOSFET is resistively connected to said second terminal, wherein said gate of said first normally on MOSFET is further connected to a drain of a first normally off enhancement mode MOSFET and a source of said first normally off enhancement mode MOSFET is connected to a source of a second normally off enhancement mode MOSFET and a drain of said second normally off enhancement mode MOSFET is connected to said second terminal, wherein said gate of said second normally on MOSFET is further connected to a drain of a third normally off enhancement mode MOSFET and a source of said second normally off enhancement mode MOSFET is connected to a source of a fourth normally off enhancement mode MOSFET and a drain of said fourth normally off enhancement mode MOSFET is connected to said first terminal, wherein a gate of said first normally off enhancement mode MOSFET is resistively connected to said first terminal and further connected to a gate of said second normally off enhancement mode MOSFET and said gate of said second normally off enhancement mode MOSFET is further connected to said second terminal comprising a first diode clamp, wherein a gate of said third normally off enhancement mode MOSFET is resistively connected to said second terminal and further connected to a gate of said fourth normally off enhancement mode MOSFET and said gate of said fourth normally off enhancement mode MOSFET is further connected to said first terminal comprising a second diode clamp, wherein a substrate of said first normally off enhancement mode MOSFET is connected to a substrate of said second normally off enhancement mode MOSFET and further connected to said source of said first normally on MOSFET and a substrate of said third normally off enhancement mode MOSFET is connected to a substrate of said fourth normally off enhancement mode MOSFET and further connected to a source of said second normally on MOSFET.

11. The current-limiting surge protection device of claim 10, wherein said normally on MOSFET is a depletion mode MOSFET.

12. The current-limiting surge protection device of claim 11, wherein said depletion mode MOSFET is selected from the group consisting of an NMOS and a PMOS.

13. The current-limiting surge protection device of claim 10, wherein said enhancement mode MOSFET is selected from the group consisting of an enhancement mode NMOS and an enhancement mode PMOS.

* * * * *